United States Patent
Paduraru et al.

(10) Patent No.: US 7,479,457 B2
(45) Date of Patent: Jan. 20, 2009

(54) GAS MIXTURE FOR REMOVING PHOTORESIST AND POST ETCH RESIDUE FROM LOW-K DIELECTRIC MATERIAL AND METHOD OF USE THEREOF

(75) Inventors: Cristian Paduraru, Fremont, CA (US);
Alan Jensen, White Salmon, WA (US);
David Schaefer, Vancouver, WA (US);
Robert Charatan, Portland, OR (US);
Tom Choi, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/220,710

(22) Filed: Sep. 8, 2005

(65) Prior Publication Data

US 2007/0054496 A1    Mar. 8, 2007

(51) Int. Cl.
*H01L 21/461* (2006.01)
(52) U.S. Cl. .................. 438/708; 438/709; 438/727; 438/729; 438/731
(58) Field of Classification Search .................. 438/708, 438/709, 727, 729, 731
See application file for complete search history.

(56) References Cited

U.S. PATENT DOCUMENTS

| | | | |
|---|---|---|---|
| 4,201,579 A | 5/1980 | Robinson et al. |
| 6,080,270 A | 6/2000 | Tabrez et al. |
| 6,281,135 B1 | 8/2001 | Han et al. |
| 6,362,110 B1 | 3/2002 | Marks |
| 6,377,437 B1 | 4/2002 | Sexton et al. |
| 6,388,383 B1 | 5/2002 | Ni et al. |
| 6,426,304 B1 | 7/2002 | Chien et al. |
| 6,511,916 B1 | 1/2003 | Wu |
| 6,551,939 B2 | 4/2003 | Takamatsu et al. |
| 6,552,296 B2 | 4/2003 | Smith et al. |
| 6,567,258 B2 | 5/2003 | Sexton et al. |
| 6,579,465 B1 | 6/2003 | Takamatsu et al. |
| 6,641,698 B2 | 11/2003 | Kabansky |
| 6,669,783 B2 | 12/2003 | Sexton et al. |
| 6,680,164 B2 | 1/2004 | Nguyen et al. |
| 6,692,649 B2 | 2/2004 | Collison et al. |
| 6,713,402 B2 | 3/2004 | Smith et al. |

(Continued)

FOREIGN PATENT DOCUMENTS

JP    59-011629    1/1984

(Continued)

OTHER PUBLICATIONS

Written Opinion deted Oct. 25, 2006 for SG 200606191-5.

(Continued)

*Primary Examiner*—Binh X Tran
(74) *Attorney, Agent, or Firm*—Buchanan Ingersoll & Rooney PC (57) ABSTRACT

Atomic oxygen generated in oxygen stripping plasmas reacts with and damages low-k dielectric materials during stripping of dielectric post etch residues. While damage of low-k dielectric materials during stripping of dielectric post etch residues is lower with hydrogen stripping plasmas, hydrogen stripping plasmas exhibit lower strip rates. Inclusion of oxygen in a hydrogen stripping plasma improves both photoresist strip rate and uniformity, while maintaining a hydrogen to oxygen ratio avoids low-k dielectric material damage.

14 Claims, 8 Drawing Sheets

U.S. PATENT DOCUMENTS

| | | |
|---|---|---|
| 6,777,173 B2 | 8/2004 | Chen et al. |
| 6,777,344 B2 | 8/2004 | Annapragada et al. |
| 6,805,139 B1 | 10/2004 | Savas et al. |
| 6,834,656 B2 | 12/2004 | Qingyuan et al. |
| 6,852,636 B1 | 2/2005 | O'Donnell |
| 6,933,246 B2 | 8/2005 | Buchanan et al. |
| 6,991,739 B2 * | 1/2006 | Kawaguchi et al. ........... 216/67 |
| 7,014,788 B1 | 3/2006 | Fujimura et al. |
| 2004/0018715 A1 | 1/2004 | Sun et al. |
| 2004/0072440 A1 | 4/2004 | Kim et al. |
| 2004/0219789 A1 * | 11/2004 | Wood et al. ................ 438/690 |
| 2005/0112883 A1 * | 5/2005 | Savas et al. ................. 438/689 |
| 2005/0230047 A1 * | 10/2005 | Collins et al. .......... 156/345.33 |
| 2006/0046470 A1 * | 3/2006 | Becknell et al. ............. 438/637 |

FOREIGN PATENT DOCUMENTS

| | | |
|---|---|---|
| WO | WO 97/11482 A2 | 3/1997 |
| WO | 2006/025123 A1 | 3/2006 |

OTHER PUBLICATIONS

Australian Search Report dated Oct. 25, 2006 for SG200606191-5.

\* cited by examiner

GAS MIXTURE FOR REMOVING PHOTORESIST AND POST ETCH RESIDUE FROM LOW-K DIELECTRIC MATERIAL AND METHOD OF USE THEREOF

BACKGROUND

During a standard dielectric etch processing sequence, a semiconductor substrate having a dielectric layer is masked with a sacrificial masking layer such as photoresist and hard mask, the dielectric in those areas not protected by the mask is etched, and then the residue remaining from the mask and caused by the etch process, such as residue from photoresist, is removed.

SUMMARY

Provided is a method of removing photoresist and post etch residue from a semiconductor substrate having a layer of low-k dielectric material comprising introducing a semiconductor substrate having a layer of low-k dielectric material having photoresist and post etch residue thereon into a downstream reaction chamber and generating plasma comprising reactive species in an upstream applicator. The reactive species comprise atomic hydrogen and atomic oxygen, atomic oxygen passivates applicator surfaces exposed to the plasma, the plasma is generated from a gas mixture comprising oxygen, hydrogen, and inert carrier gas, and the volume ratio of hydrogen to oxygen is greater than 2:1. The reactive species are introduced into the downstream reaction chamber and atomic hydrogen removes photoresist and post etch residue from the low-k dielectric material.

Also provided is a gas mixture for removing photoresist and post etch residue from a semiconductor substrate having a layer of low-k dielectric material comprising hydrogen and oxygen in a volume ratio of greater than 2:1 and inert carrier gas. Plasma generated from the gas mixture comprises atomic hydrogen and atomic oxygen, atomic oxygen passivates surfaces exposed to the plasma, and atomic hydrogen removes photoresist and post etch residue from the low-k dielectric material.

BRIEF DESCRIPTION OF THE FIGURES OF THE DRAWINGS

FIG. 8 shows Scanning Electron Microscopy (SEM) results of residue removal from a low-k dielectric material.

DETAILED DESCRIPTION

Oxygen stripping plasmas are beneficial for stripping dielectric post etch residues when the dielectric is a form of $SiO_2$, as oxygen stripping plasmas remove the residue at high rates and do not damage the dielectric. On the other hand, the use of an oxygen stripping plasma is not beneficial for stripping dielectric post etch residues when the dielectric is a low-k dielectric material, as such materials usually contain carbon, and atomic oxygen in the plasma would react with the carbon, thereby damaging the low-k dielectric material.

"Low-k dielectric" materials are defined herein as materials with a dielectric constant k that is less than 3. Low-k materials include, but are specifically not limited to, benzocyclobutene or BCB; Flare™ manufactured by Allied Signal® of Morristown, N.J., a division of Honeywell, Inc., Minneapolis, Minn.; one or more of the Parylene dimers available from Union Carbide® Corporation, Danbury, Conn.; polytetrafluoroethylene or PTFE; and SiLK®. One interesting class of organic low-k materials is compounds including organosilicate glass, or OSG. By way of example, but not limitation, such organosilicate dielectrics include CORAL™ from Novellus of San Jose, Calif.; Black Diamond™ from Applied Materials of Santa Clara, Calif.; Sumika Film® available from Sumitomo Chemical America, Inc., Santa Clara, Calif., HOSP™ from Allied Signal of Morristown, N.J, and LKD products from JSR Micro of Sunnyvale, Calif. Organosilicate glass materials have carbon and hydrogen atoms incorporated into the silicon dioxide lattice which lowers the dielectric constant of the material.

Hydrogen stripping plasmas may also be used for stripping dielectric post etch residues. While damage of low-k dielectric materials is minimal with hydrogen stripping plasmas as compared to oxygen stripping plasmas, hydrogen stripping plasmas exhibit lower strip rates than oxygen stripping plasmas.

Figure 1:
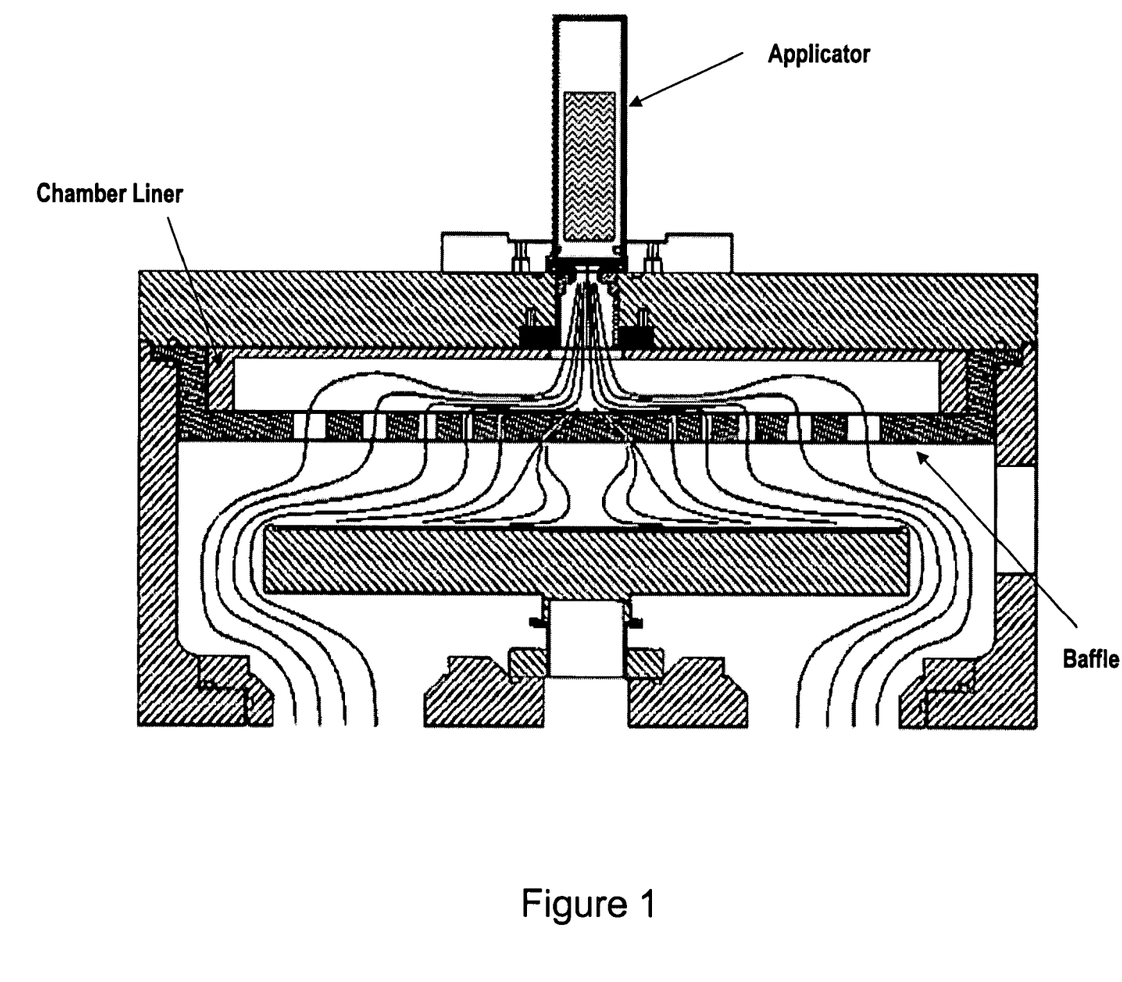
FIG. 1 shows a microwave reaction chamber having, inter alia, an applicator in which plasma containing reactive species is generated, a baffle through which reactive species are introduced into the reaction chamber, and a chamber liner which is exposed to the reactive species before the reactive species are introduced into the reaction chamber.

The use of a remote plasma source, for example, a preferred upstream microwave reactor, does not introduce energetic ions to the semiconductor substrate, but does introduce atomic hydrogen to the semiconductor substrate, and as a consequence, is also beneficial for reducing low-k dielectric material damage. Remote plasma sources are described in commonly owned U.S. Pat. Nos. 6,080,270, 6,388,383, 6,692,649, and 6,777,173, incorporated herein by reference in their entirety. Referring to the upstream microwave reactor of FIG. 1, plasma including reactive species such as atomic hydrogen may be generated in an applicator upstream of the reaction chamber and the reactive species introduced into the downstream reaction chamber. While the reaction chamber may be maintained at 750 mTorr-1 Torr, the pressure in the applicator may be about 6 Torr. The microwave reaction chamber may also comprise a chamber liner, which is exposed to reactive species during the stripping operation.

It has been discovered that inclusion of oxygen in a hydrogen stripping plasma improves both photoresist strip rate and uniformity and that by maintaining a hydrogen to oxygen ratio low-k dielectric material damage can be avoided. It is believed that atomic oxygen passivates reaction chamber surfaces exposed to the reactive species, such as, for example, the applicator, a baffle, or a chamber liner, so as to reduce recombination of atomic hydrogen on the exposed surfaces.

Thus, oxygen indirectly enhances photoresist strip rate by increasing the relative amount of atomic hydrogen available for the strip process by substantially reducing the probability of atomic hydrogen recombination on such exposed surfaces. It is believed that as oxygen passivates the exposed surfaces, there are fewer sites with which atomic hydrogen may react and therefore, the amount of atomic hydrogen distributed in the reaction chamber is increased. It is believed that as oxygen passivates the exposed surfaces, there are fewer sites that atomic oxygen may passivate, and eventually, saturation occurs. Thus, at higher percentages of oxygen, atomic oxygen will directly react with and damage the low-k dielectric material. As the recombination rate of hydrogen on quartz is lower the recombination rate of hydrogen on other materials, reaction chamber surfaces exposed to the reactive species, such as, for example, the applicator, a baffle, or a chamber liner, are preferably comprised of quartz.

The reactive species may be distributed into the reaction chamber through a baffle having surfaces exposed to the reactive species, and atomic oxygen may passivate the surfaces of the baffle exposed to the reactive species, thereby reducing recombination of atomic hydrogen at the surfaces of the baffle exposed to the reactive species. Atomic oxygen may passivate the surface of a chamber liner before being introduced into the reaction chamber, thereby reducing the probability of atomic hydrogen recombination at the chamber liner surface.

Figure 2:
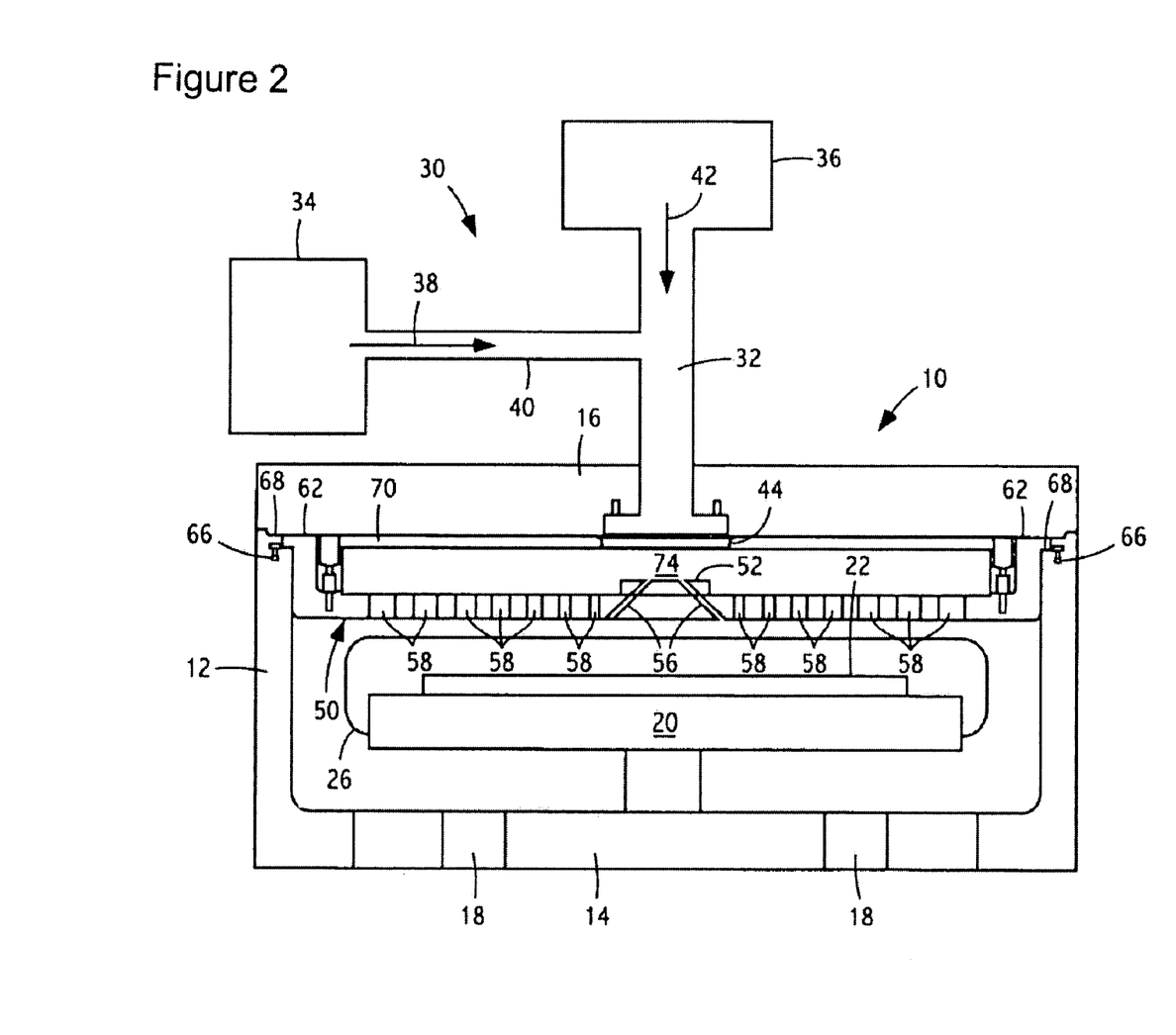
FIG. 2 depicts an embodiment of a resist stripping chamber including a baffle.

FIG. 2 depicts an exemplary embodiment of a resist stripping chamber 10 in which a baffle 50 is mounted. The resist stripping chamber 10 includes a side wall 12, a bottom wall 14 and a cover 16. The cover 16 is preferably pivotably attached by hinges to the side wall 12 to allow the cover 16 to be opened to access the interior of the resist stripping chamber 10 to remove the baffle 50 for cleaning or replacement, or for other purposes. The resist stripping chamber 10 includes vacuum ports 18 in the bottom wall 14.

The resist stripping chamber 10 also includes a substrate support 20 on which a semiconductor substrate 22, such as a wafer, is mounted during resist stripping. The substrate support 20 preferably comprises an electrostatic chuck adapted to clamp the substrate 22. The substrate support 20 preferably includes a heater, such as a resistive heating element, adapted to maintain the substrate 22 at a suitable temperature during the resist stripping process. The substrate 22 can be introduced into and removed from the resist stripping chamber 10 through a substrate entry port 26 provided in the sidewall 12. For example, the substrate 22 can be transferred under vacuum into the interior of the resist stripping chamber 10 from an etching chamber located proximate the resist stripping chamber.

A remote plasma source 30 is arranged in fluid communication with the resist stripping chamber 10. The plasma source 30 is operable to produce plasma and to supply reactive species into the interior of the resist stripping chamber 10 through a passage 32 connected to the resist stripping chamber 10. The illustrated embodiment of the plasma source 30 includes a remote energy source 34 and a stripping gas source 36. The energy source 34 can be any suitable source and is preferably a microwave generator. Exemplary apparatuses including a microwave generator are available from Lam Research Corporation, Freemont, Calif. In a preferred embodiment, the microwave generator operates at a frequency of 2.45 GHz, and preferably has a power in the range of about 500 to about 3000 W, more preferably in the range of about 1000 to about 1500 W. Microwaves, represented by arrow 38, are produced by the microwave generator 34 and propagated through a waveguide 40 into the passage 32.

The gas source 36 is operable to supply process gas, represented by arrow 42, into the passage 32, or applicator, where the gas is energized into the plasma state by the microwaves produced by the energy source 34. Reactive species pass through an opening 44 into the interior of the resist stripping chamber 10.

The reactive species are distributed in the resist stripping chamber 10 by a baffle 50 located between the cover 16 and the substrate support 20 before the reactive species flow onto the substrate 22 and strip the resist. The substrate 22 is preferably heated by a heater located in the substrate support 20 during resist stripping. Waste products generated during resist stripping are pumped out of the resist stripping chamber 10 through the exhaust ports 18.

Figure 3:
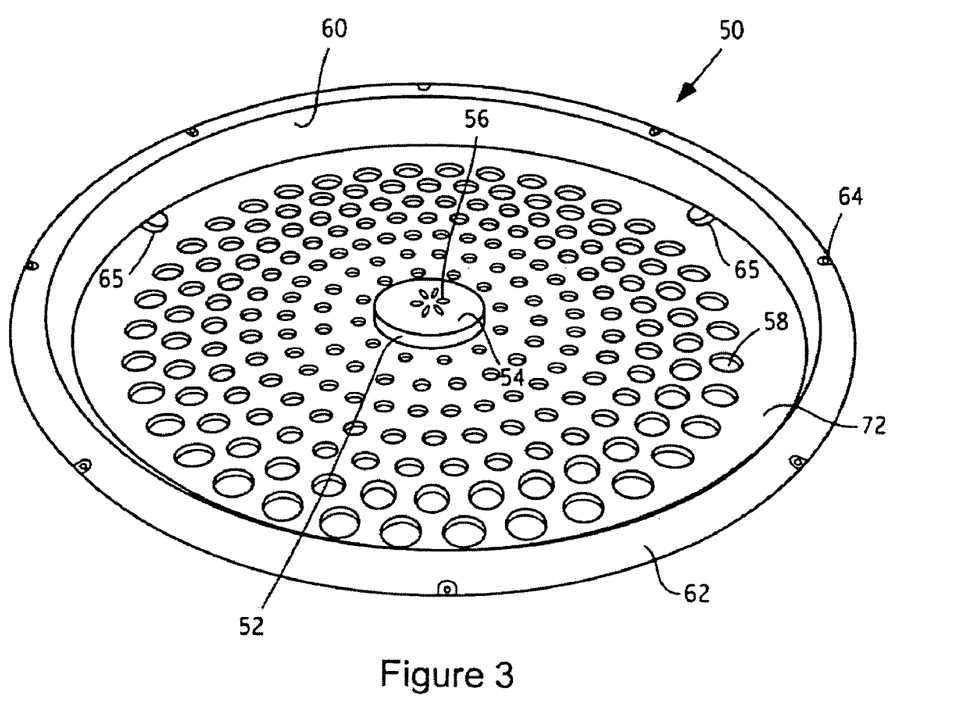
FIG. 3 illustrates an embodiment of a baffle.

As shown in FIG. 3, the baffle 50 may be a circular, one-piece body. The resist stripping chamber 10 is preferably cylindrical for single wafer processing. When adapted to be installed in a cylindrical resist stripping chamber 10, the baffle 50 preferably has a diameter larger than the width, e.g., diameter, of the interior of the resist stripping chamber 10 so that the baffle can be supported by the side wall 12. The baffle 50 includes an inner portion having a raised central portion 52 with an upper surface 54 and through passages 56. In the illustrated embodiment of the baffle 50, the central portion 52 includes six circumferentially spaced-apart passages 56. The number of passages 56 can be either more or less than six in other embodiments. In the embodiment, ultraviolet (UV) radiation that passes through the passage 32 impinges on the upper surface 54 in a direction generally perpendicular to the upper surface. The passages 56 are preferably oriented at an acute angle relative to the upper surface 54 to prevent a direct line of sight for the UV radiation to pass through the baffle 50. Consequently, the UV radiation is reflected from the upper surface 54 and the walls of the passages 56 so that it does not damage the substrate 22.

The baffle 50 also includes through passages 58 arranged between the central portion 52 and a peripheral portion 60. The passages 58 are adapted to distribute reactive species in a desired flow pattern into the interior of the resist stripping chamber 10. As shown in FIG. 3, the passages 58 preferably are in the form of concentrically-arranged rows of holes. The passages 58 preferably have a round cross section and preferably increase in cross-sectional size (e.g., diameter) in the radial outward direction of the baffle 50 from the central portion 52 toward the peripheral portion 60.

As shown in FIG. 3, the peripheral portion 60 of the baffle 50 includes a flange 62 having circumferentially spaced-apart holes 64 for receiving fasteners 66, e.g., threaded bolts (FIG. 2), to attach the baffle 50 to the top surface 68 of the side wall 12 of the resist stripping chamber 10. The baffle 50 can be detached from the side wall 12 and removed from the resist stripping chamber 10 to treat or replace the baffle, as desired.

Figure 4:
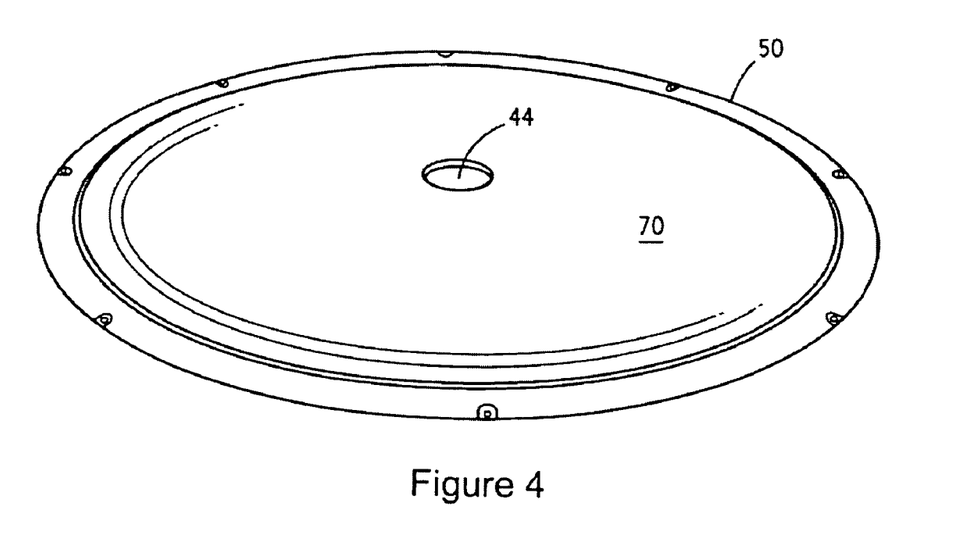
FIG. 4 illustrates a liner positioned on the baffle shown in FIG. 3.

As shown in FIG. 4, a liner 70 may be adapted to be supported on the upper surface 72 of the baffle 50 to minimize the deposition of materials on the bottom surface of the cover 16 during resist stripping processes. Circumferentially spaced-apart spacers 65 are provided on the upper surface 72 to support the liner 70 and form a plenum 74 therebetween (FIG. 2). The liner 70 includes a centrally located passage 44 through which reactive species pass from the passage 32 into the plenum 74.

Provided is a method of removing photoresist and post etch residue from a semiconductor substrate having a layer of low-k dielectric material comprising introducing a semiconductor substrate having a layer of low-k dielectric material having photoresist and post etch residue thereon into a downstream reaction chamber and generating plasma comprising reactive species, such as atomic oxygen and atomic hydrogen, in an upstream applicator. Atomic oxygen passivates applicator surfaces exposed to the plasma. The plasma is generated from a gas mixture comprising oxygen, hydrogen, and inert carrier gas, with a volume ratio of hydrogen to oxygen of greater than 2:1, preferably greater than 5:1, more preferably greater than 10:1, even more preferably greater than 20:1, and even more preferably greater than 40:1. The plasma is preferably generated from a gas mixture comprising 0.05-0.3% by volume oxygen, more preferably about 0.1% by volume oxygen, and 1-10% by volume hydrogen. The inert carrier gas may comprise a noble gas, such as, for example, helium, argon, or mixtures thereof. Hydrogen and helium may be supplied as $H_2He$ and the oxygen may be supplied as $O_2$. The gas mixture preferably has a total flow rate of up to about 6000-7000 sccm, more preferably up to about 6500 sccm. The reactive species are introduced into the downstream reaction chamber and atomic hydrogen removes photoresist and post etch residue from the low-k dielectric material.

As it is believed that atomic oxygen passivates surfaces exposed to the reactive species, such as, for example, the surface of the applicator, for a plasma generated from a gas mixture comprising about 0.1% by volume oxygen, 1-10% by volume hydrogen, and inert carrier gas, the reactive species introduced into the reaction chamber that are present at the semiconductor substrate surface comprise less than about 0.1% by volume oxygen. The gas mixture from which the plasma is formed is preferably free of fluorocarbons, hydrofluorocarbons, ammonia, and $N_2H_2$. Accordingly, the gas mixture preferably consists essentially of oxygen, hydrogen, and inert carrier gas. The inert carrier gas may comprise a noble gas, such as, for example, helium, argon, or mixtures thereof. Hydrogen and helium may be supplied as $H_2He$ and the oxygen may be supplied as $O_2$.

The incorporation of oxygen in the hydrogen stripping gas is beneficial in sequential processing of semiconductor wafers in that a highly repeatable stripping process can be achieved from wafer to wafer. Preferably, the reaction chamber is seasoned prior to stripping the photoresist from each wafer. Accordingly, the reaction chamber is seasoned prior to introducing a substrate into the reaction chamber. The seasoning may comprise processing a bare silicon wafer or Waferless Autoclean™. The seasoning gas is energized into a plasma state for a time sufficient to remove polymer byproducts deposited on chamber surfaces during the preceding stripping process. The seasoning gas is preferably an oxygen-containing gas, such as, for example, a $He:H_2:O_2$ gas mixture or preferably $O_2N_2$. It is believed that seasoning with an oxygen-containing gas passivates exposed surfaces of the reaction chamber with oxygen. Thus, a method of sequentially processing semiconductor wafers comprises removing photoresist and post etch residue from a semiconductor substrate as described above, removing the semiconductor wafer from the reaction chamber, and repeating.

As disclosed above, additionally provided is a gas mixture for removing photoresist and post etch residue from a semiconductor substrate having a layer of low-k dielectric material comprising hydrogen and oxygen in a volume ratio of greater than 2:1, preferably greater than 5:1, more preferably greater than 10:1, even more preferably greater than 20:1, and even more preferably greater than 40:1, and inert carrier gas. Plasma generated from the gas mixture comprises atomic hydrogen and atomic oxygen, wherein atomic oxygen passivates surfaces exposed to the plasma, and wherein atomic hydrogen removes photoresist and post etch residue from the low-k dielectric material. The gas mixture preferably comprises 0.05-0.3% by volume oxygen, more preferably about 0.1% by volume oxygen, and 1-10% by volume hydrogen. The inert carrier gas may comprise a noble gas, such as, for example, helium, argon, or mixtures thereof. Hydrogen and helium may be supplied as $H_2He$ and the oxygen may be supplied as $O_2$.

As referred to herein, the intensity of hydrogen or oxygen was measured by recording the emission intensity of the 656.3 nm line of atomic hydrogen or the 777 nm line of atomic oxygen, respectively, by Optical Emission Spectroscopy in the upstream applicator of a microwave reactor, in which plasma was generated, prior to the reactive species being introduced into a downstream reaction chamber. The recorded emission intensity is proportional to the concentration of species in the plasma, but dependent upon such factor as, for example, electron temperature and collision cross sectional area.

Figure 5:
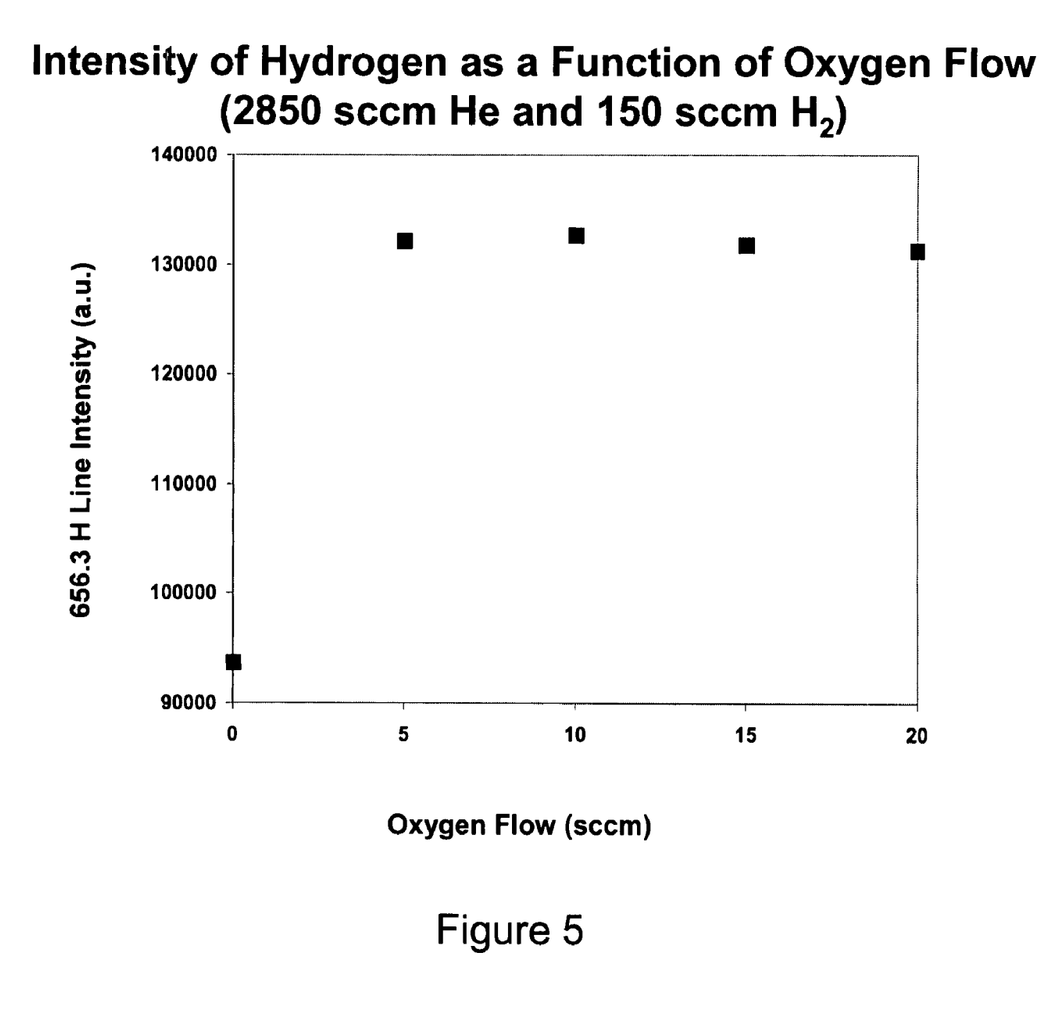
FIG. 5 shows the intensity of hydrogen as a function of oxygen flow in plasma formed from helium, hydrogen, and oxygen in the apparatus of FIG. 1.

FIG. 5 shows the intensity of hydrogen as a function of oxygen flow in plasma formed from helium, hydrogen, and oxygen. Flow rates of 2850 sccm He and 150 sccm $H_2$ (5% by volume) were used. The intensity of hydrogen is observed to increase from 0 sccm $O_2$ to 5 sccm $O_2$ (0.17% by volume). Greater than 5 sccm of oxygen did not further significantly increase the intensity of hydrogen.

Figure 6:
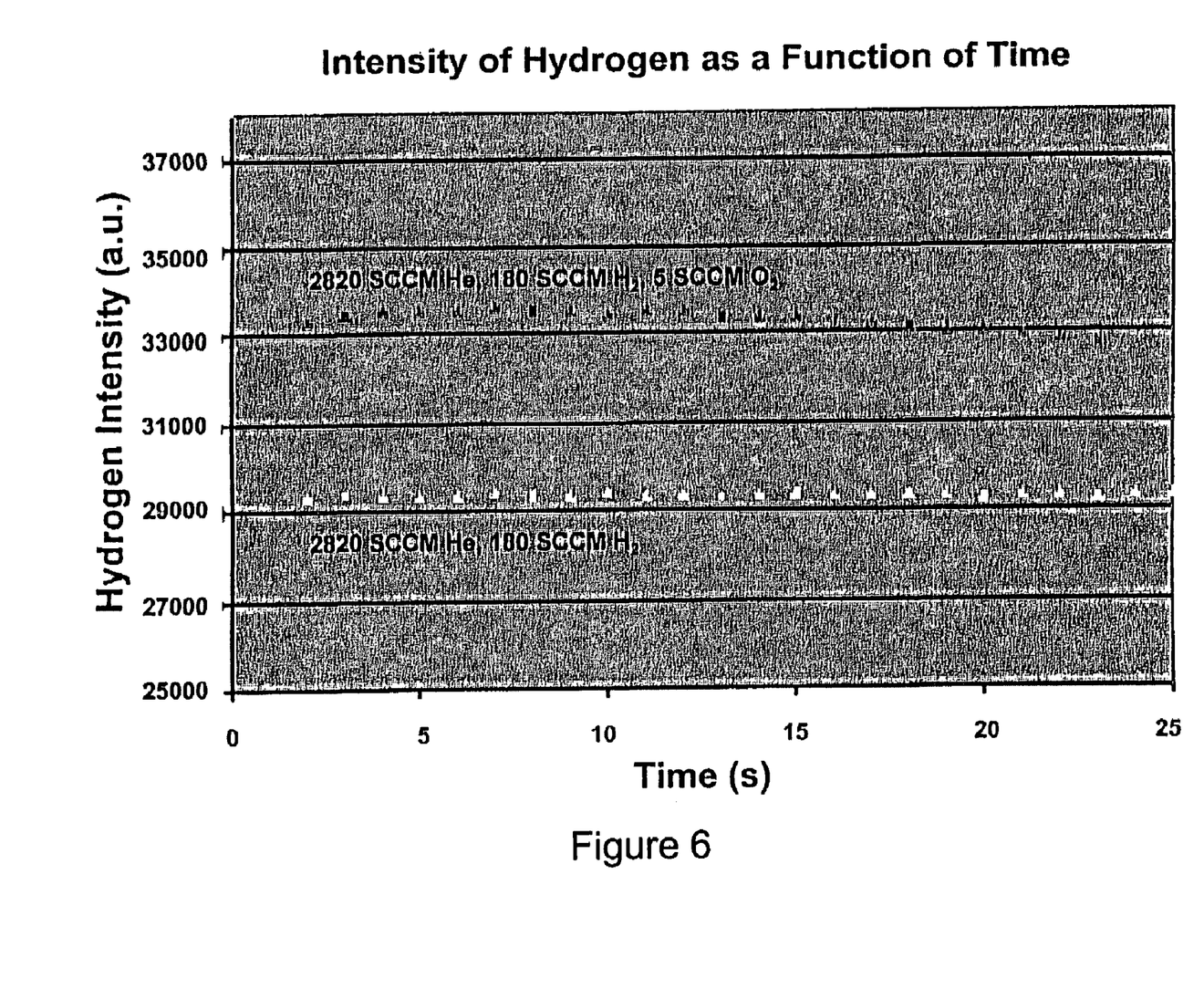
FIGS. 6 and 7 show the intensity of hydrogen as a function of time in plasma formed from helium and hydrogen and plasma formed from helium, hydrogen, and oxygen, in the apparatus of FIG. 1.
Figure 7:
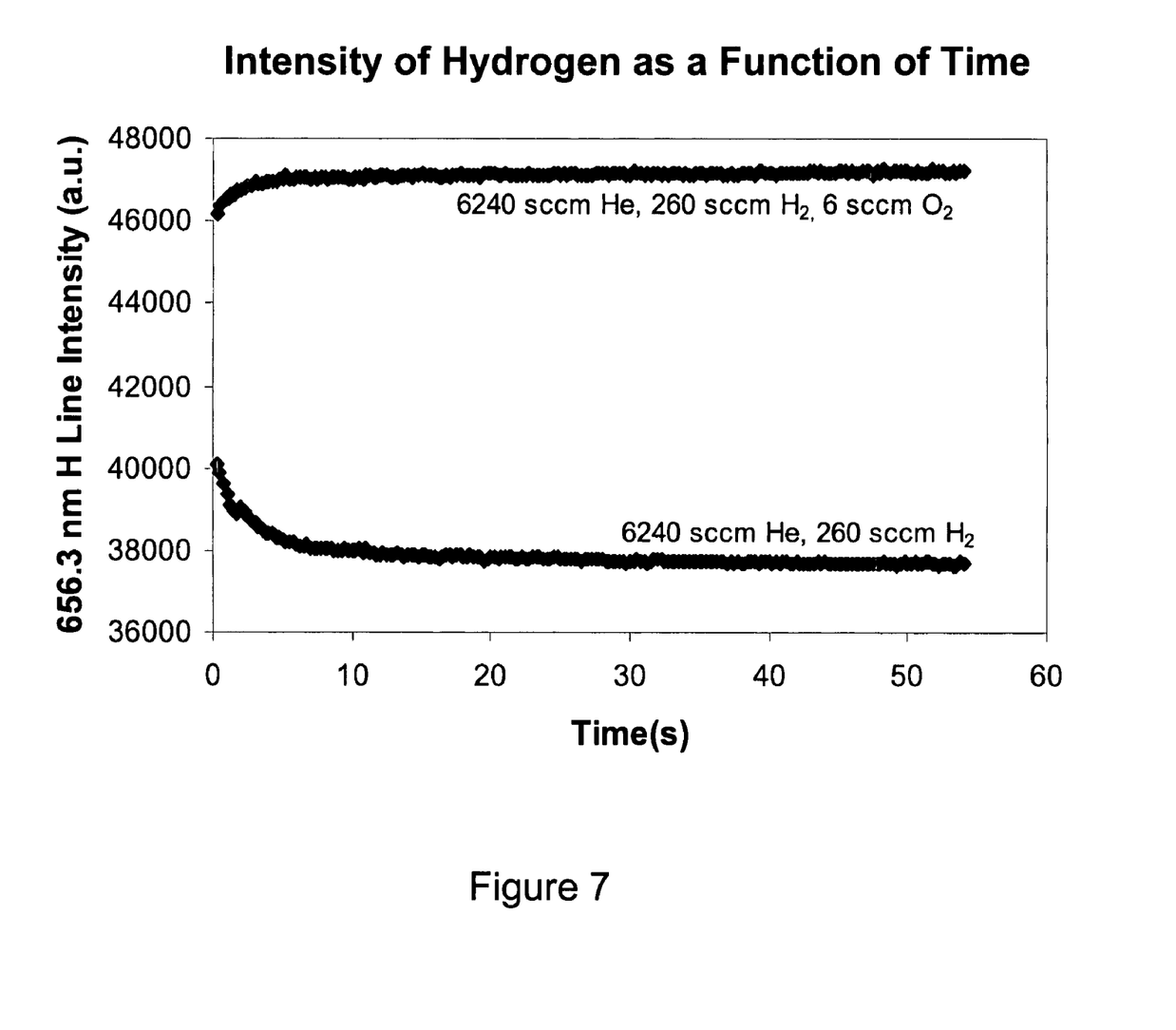

FIGS. 6 and 7 show the intensity of hydrogen as a function of time in plasma formed from helium and hydrogen and plasma formed from helium, hydrogen, and oxygen. In the process illustrated by FIG. 6, in which the power was 2600 W, the plasma formed from 2820 sccm He, 180 sccm $H_2$, and 5 sccm $O_2$ (0.17% by volume) exhibited a greater intensity of hydrogen than did the plasma formed from 2820 sccm He and 180 sccm $H_2$ (6% by volume).

In the process illustrated by FIG. 7, the intensity of hydrogen recorded in plasma generated from 6240 sccm He, 260 sccm $H_2$, and 6 sccm $O_2$ (0.09% by volume) is greater than the intensity of hydrogen recorded in plasma generated from 6240 sccm He and 260 sccm $H_2$ (4% by volume). Furthermore, for plasma generated from 6240 sccm He and 260 sccm $H_2$, the recorded intensity of hydrogen decays to a saturation level, suggesting the loss of atomic hydrogen during the process. It is believed that the dominant mechanism of atomic hydrogen loss is atomic hydrogen recombination at reaction chamber surfaces. Conversely, for plasma generated from 6240 sccm He, 260 sccm $H_2$, and 6 sccm $O_2$, the recorded intensity of hydrogen increases to a saturation level, suggesting higher atomic hydrogen concentration in the plasma and reduced atomic hydrogen recombination loss. It is believed that atomic oxygen generated from inclusion of 6 sccm $O_2$ passivates reaction chamber surfaces, blocking available sites for atomic hydrogen recombination and reducing the probability of atomic hydrogen recombination, and thus, a higher concentration of atomic hydrogen is available for reaction at the wafer surface.

In the process illustrated by FIG. 7, the power was 3000 W, the chamber pressure was 750 mTorr, and the substrate temperature was 280° C. Substrate temperatures of greater than 250° C. are preferred. Accordingly, the substrate, preferably a semiconductor wafer, may be supported on a substrate support heated to a temperature of at least 250° C. The substrate can be supported on a high temperature substrate support with or without clamping of the substrate. Electrostatic chucks suitable for use at high temperatures are disclosed in commonly owned U.S. Pat. Nos. 6,377,437, 6,567,258, 6,669,783, incorporated herein by reference in their entirety. If an electrostatic chuck is used, it is not necessary to activate the electrostatic clamping feature of the chuck.

EXAMPLES

Figure 8A:
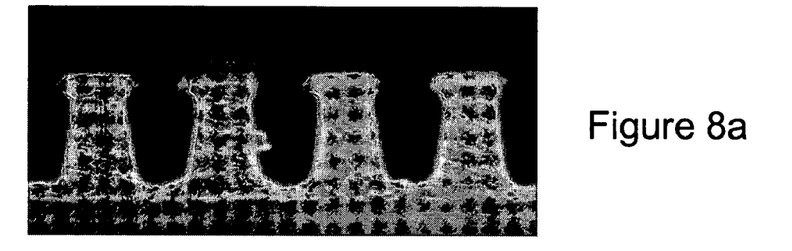
FIG. 8*a* shows SEM results of residue removal from a low-k dielectric material using 6240 standard cubic centimeters per minute (sccm) He and 260 sccm $H_2$.
Figure 8B:
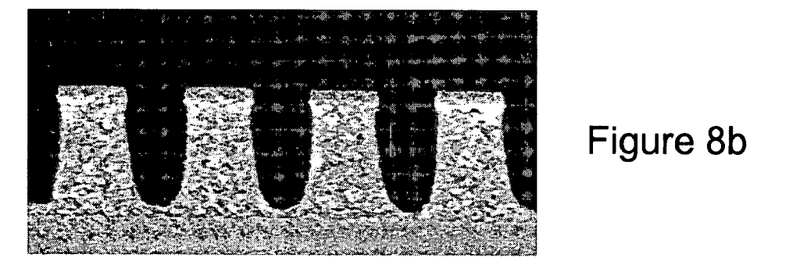
FIG. 8*b* shows SEM results of residue removal from a low-k dielectric material using 6240 sccm He, 260 sccm $H_2$, and 5 sccm $O_2$.
Figure 8C:
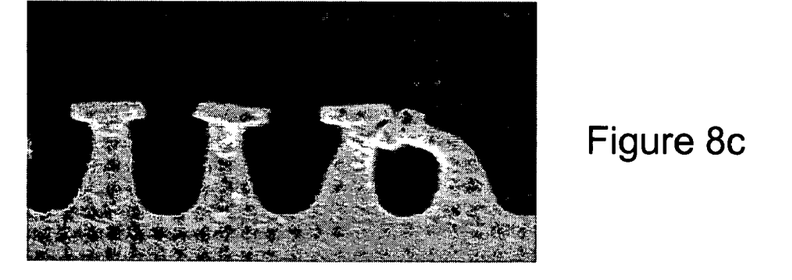
FIG. 8*c* shows SEM results of residue removal from a low-k dielectric material using 6240 sccm He, 260 sccm $H_2$, and 20 sccm $O_2$.

FIG. 8 shows SEM results of residue removal from a low-k dielectric material at a power of 3000 W (after treatment with hydrofluoric acid for 30 seconds). FIG. 8a shows SEM results of residue removal from a low-k dielectric material using 6240 sccm He and 260 sccm $H_2$ (4% by volume). FIG. 8b shows SEM results of residue removal from a low-k dielectric material using 6240 sccm He, 260 sccm $H_2$, and 5 sccm $O_2$ (0.08% by volume). FIG. 8c shows SEM results of residue removal from a low-k dielectric material using 6240 sccm He, 260 sccm $H_2$, and 20 sccm $O_2$ (0.31% by volume $O_2$).

Figure 9:
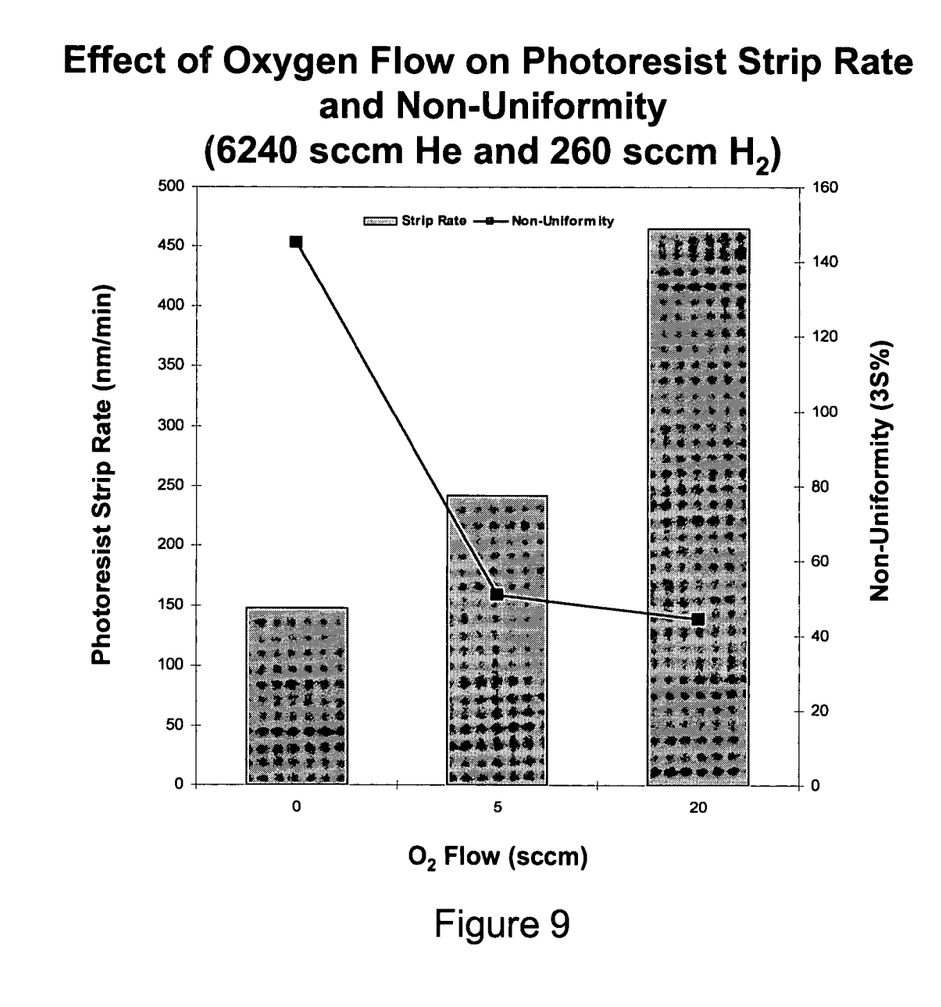
FIG. 9 shows photoresist strip rates minus photoresist shrinkage and uniformity for residue removal from a low-k dielectric material using 6240 sccm He, 260 sccm $H_2$, and 0 sccm $O_2$, 5 sccm $O_2$, or 20 sccm $O_2$.

FIG. 9 shows photoresist strip rates minus photoresist shrinkage and uniformity for residue removal from a low-k dielectric material using 6240 sccm He, 260 sccm $H_2$, and 0 sccm $O_2$, 5 sccm $O_2$, or 20 sccm $O_2$.

As can be seen from FIGS. 8 and 9, residue removal from a low-k dielectric material, photoresist strip rate (photoresist strip rate minus photoresist shrinkage), and non-uniformity (shrinkage subtracted) are all improved using 6240 sccm He, 260 sccm $H_2$, and 5 sccm $O_2$ (total flow rate of 6505 sccm) as compared to 6240 sccm He, 260 sccm $H_2$, and 0 sccm $O_2$, preferably without low-k dielectric material damage. The photoresist shrinkage taken into account in calculating the photoresist strip rate and non-uniformity occurs as a result of using a heated electrode. As can further be seen from FIGS. 8 and 9, while 6240 sccm He, 260 sccm $H_2$, and 20 sccm $O_2$ exhibits better photoresist strip rate and non-uniformity, 6240 sccm He, 260 sccm $H_2$, and 20 sccm $O_2$ exhibits extensive low-k dielectric material damage.

While various embodiments have been described, it is to be understood that variations and modifications may be resorted to as will be apparent to those skilled in the art. Such variations and modifications are to be considered within the purview and scope of the claims appended hereto.

The invention claimed is:

1. A method of removing photoresist and post etch residue from a semiconductor substrate having a layer of low-k dielectric material comprising:
   introducing a semiconductor substrate having a layer of low-k dielectric material having photoresist and post etch residue thereon into a downstream reaction chamber;
   generating plasma comprising reactive species in an upstream applicator, wherein the reactive species comprise atomic hydrogen and atomic oxygen, wherein atomic oxygen passivates applicator surfaces exposed to the plasma, wherein the plasma is generated from a gas mixture comprising 0.05-0.1% by volume oxygen, 1-10% by volume hydrogen, and balance inert carrier gas and
   introducing the reactive species into the downstream reaction chamber, wherein atomic hydrogen removes photoresist and post etch residue from the low-k dielectric material.

2. The method of claim 1, wherein the oxygen is supplied as $O_2$.

3. The method of claim 1, wherein the gas mixture has a total flow rate of up to about 6000-7000 standard cubic centimeters per minute.

4. The method of claim 1, wherein the semiconductor substrate is a semiconductor wafer supported on a substrate support heated to a temperature of at least 250° C.

5. The method of claim 1, wherein the reactive species are introduced into the downstream reaction chamber through a quartz baffle and further wherein atomic oxygen passivates baffle surfaces exposed to the plasma.

6. The method of claim 1, wherein the reactive species are exposed to a quartz chamber liner before being introduced into the downstream reaction chamber and further wherein atomic oxygen passivates chamber liner surfaces exposed to the plasma.

7. The method of claim 1, wherein the upstream applicator is comprised of quartz.

8. The method of claim 1, wherein the volume ratio of hydrogen to oxygen is greater than 10:1.

9. The method of claim 1, wherein the volume ratio of hydrogen to oxygen is greater than 20:1.

10. The method of claim 1, wherein the volume ratio of hydrogen to oxygen is greater than 40:1.

11. The method of claim 1, wherein the inert carrier gas is selected from the group consisting of helium, argon, and mixtures thereof.

12. The method of claim 11, wherein the inert carrier gas is helium and further wherein hydrogen and helium are supplied as $H_2He$.

13. The method of claim 1, further comprising seasoning the reaction chamber with an oxygen-containing gas, which is energized into a plasma state for a time sufficient to remove polymer byproducts deposited on chamber surfaces, prior to introducing the semiconductor substrate into the downstream reaction chamber.

14. A method of sequentially processing semiconductor wafers comprising:
   a) removing photoresist and post etch residue from a semiconductor substrate according to the method of claim 13;
   b) removing the semiconductor wafer from the downstream reaction chamber; and
   c) repeating steps a) and b).

* * * * *